United States Patent
Kohda (10) Patent No.: US 7,566,639 B2
(45) Date of Patent: Jul. 28, 2009

(54) MANUFACTURING METHOD FOR NITRIDE SEMICONDUCTOR DEVICE AND NITRIDE SEMICONDUCTOR LIGHT EMITTING DEVICE OBTAINED WITH THE SAME

(75) Inventor: Shinichi Kohda, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 13 days.

(21) Appl. No.: 11/521,553

(22) Filed: Sep. 15, 2006

(65) Prior Publication Data

US 2007/0063215 A1 Mar. 22, 2007

(30) Foreign Application Priority Data

Sep. 16, 2005 (JP) ............... 2005-271162

(51) Int. Cl.
 *H01L 21/78* (2006.01)
(52) U.S. Cl. ............... 438/463; 257/E21.599
(58) Field of Classification Search ......... 438/797, 438/460, 463; 257/683, 723, E21.599
See application file for complete search history.

(56) References Cited

U.S. PATENT DOCUMENTS 7,396,742 B2 * 7/2008 Fukuyo et al. ............ 438/463

2006/0124617 A1 * 6/2006 Hsu ..................... 219/121.67

FOREIGN PATENT DOCUMENTS

| JP | 2003-338468 A | * | 3/2003 |
|---|---|---|---|
| JP | 2003338468 | * | 3/2003 |
| JP | 2003-266185 | | 9/2003 |
| JP | 2003-338467 | | 11/2003 |
| JP | 2003-338468 | | 11/2003 |
| JP | 2003-338652 | | 11/2003 |

* cited by examiner

*Primary Examiner*—Minh-Loan T Tran
*Assistant Examiner*—Selim Ahmed
(74) *Attorney, Agent, or Firm*—Rabin & Berdo, PC (57) ABSTRACT

Processed traces are formed on at least a part of intended cutting lines A along which a wafer (10) where a nitride semiconductor lamination portion (6) is formed on a GaN based substrate (1) is divided into chips, by irradiating with a laser beam LB having a wavelength which is longer than the band gap wavelength of the GaN based substrate 1 and an electrical field intensity which causes a multiple photons absorption, while adjusting the focal point to a constant depth d within the GaN based substrate (1) from the back surface of the wafer. After that, the wafer (10) is divided into chips along cutting starting points (12) which are formed in the vicinity of the processed traces by hitting with an impact. As a result, the wafer can be easily divided into chips, and in particular, end faces of a resonator can be formed with cleavage planes when an LD is formed.

16 Claims, 6 Drawing Sheets

FIG. 10
PRIOR ART

MANUFACTURING METHOD FOR NITRIDE SEMICONDUCTOR DEVICE AND NITRIDE SEMICONDUCTOR LIGHT EMITTING DEVICE OBTAINED WITH THE SAME

FIELD OF THE INVENTION

The present invention relates to a manufacturing method for a semiconductor device, such as a light emitting diode (LED), a laser diode (LD) or a transistor element using a nitride semiconductor, and a nitride semiconductor light emitting device obtained in accordance with this method. In particular, the invention relates to a manufacturing method for a nitride semiconductor device where a wafer is divided into chips with a plane of cleavage which is a mirror surface and the yield at the time of dividing is high, and a nitride semiconductor light emitting device obtained with this method.

BACKGROUND OF THE INVENTION

Figure 10:
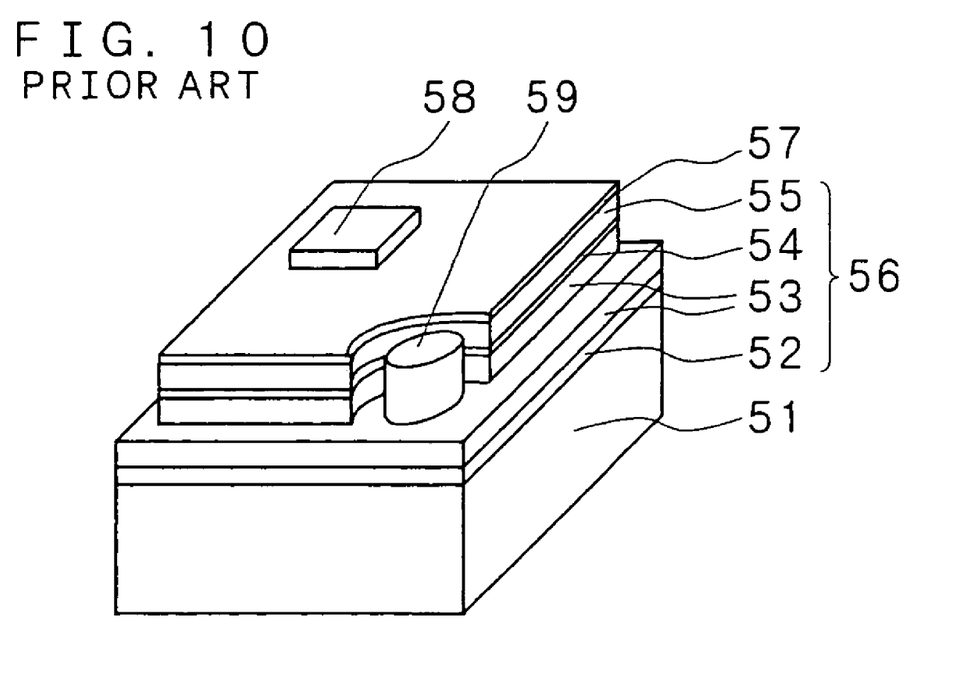
FIG. 10 is a diagram showing an example of the configuration of an LED using a conventional nitride semiconductor.

In recent years, nitride semiconductor light emitting devices such as blue light emitting diodes (LED's) and laser diodes (LD's) using a nitride semiconductor have been put into practice. An LED for emitting blue light using a nitride semiconductor in this manner is formed by, for example, as shown in FIG. 10, laminating a low temperature buffer layer 52 made of GaN or the like in accordance with an MOCVD method, an n-type layer 53 made of GaN or the like, an active layer (light emitting layer) 54 made of a material which determines the wavelength of emitted light, and the band gap energy of which is smaller than that of n-type layer 53, for example, an InGaN based (meaning that the ratio of In to Ga may vary; same hereinafter) compound semiconductor, and a p-type layer 55 made of GaN or the like on a sapphire substrate 51, so that a semiconductor lamination portion 56 is formed, providing a p-side electrode 58 on the surface of semiconductor lamination portion 56 with a light transmitting conductive layer 57 in between, and providing an n-side electrode 59 on the surface of the n-type layer 53, which is exposed by partially etching a part of the semiconductor lamination portion 56. Here, a semiconductor layer having higher band gap energy, such as an AlGaN based (meaning that the ratio of Al to Ga may vary; same hereinafter) compound, may be used in n-type layer 53 and p-type layer 55 on the active layer side, in order to increase the effects of confining carriers.

When such a nitride semiconductor light emitting device is manufactured, a large number of semiconductor light emitting devices are formed simultaneously by dividing a wafer where semiconductor layers have been grown on a substrate into separate chips. As the substrate for this wafer, a sapphire substrate is used usually, as in the example shown in FIG. 10, and an SiC substrate may be used, and thus, a material of which the lattice constant does not match with that of nitride semiconductors is used in most cases. Though in addition to these, there exist examples where an Si substrate is used, Si makes the crystallinity of the grown nitride semiconductor layers deteriorate, and Si absorbs emitted light, and thus the brightness cannot be increased, and therefore, Si is not appropriate for highly bright products having high added value.

When a wafer with this substrate is divided into separate chips, a diamond scribing method, a blade dicing method, dry etching or wet etching are generally used. This diamond scribing method is a method for scratching the rear surface of a wafer and then cracking the wafer, but since sapphire is very hard and cannot be deeply scratched, and in addition, nitride semiconductors are, likewise, very hard, the wafer cannot be cracked with high precision along the intended dividing lines and the cracking extends in unintended directions, and therefore, the ratio of defects increases. In addition, in the case where a wafer is divided into separate chips through blade dicing or etching, since sapphire and nitride semiconductors are very hard, dicing and etching takes a very long time, and at the same time, no mirror surface such as in a plane of cleavage can be obtained, and therefore, a problem arises, particularly in the case where a semiconductor laser is manufactured, such that the reflectance on the resonant surface becomes low.

Meanwhile, in the case where a wafer is divided into chips in this manner, as shown in, for example Japanese Unexamined Patent Publication 2003-338468, a method for forming a denatured region through multiple photons absorption along lines which the substrate is to be divided, by irradiating the wafer with a laser beam of which the focal point is adjusted inside the substrate, forming the cutting starting region along the lines which the substrate is to be divided on the basis of this denatured region and dividing the wafer.

As described above, the light emitting device using the nitride semiconductor is formed by growing nitride semiconductor layers mainly on sapphire substrates. However, sapphire and nitride semiconductor layers are very hard and breakable and are almost impossible to cleave, and therefore, chips are obtained through dicing, dry etching or the like, which takes a very long time, and even when a method for dicing on the way and cracking the substrate is attempted, a problem arises, such that cracks run in unexpected directions, making the yield very low. In particular, though it is necessary in a laser device using the nitride semiconductor to form an end face of a resonant as a surface perpendicular to the direction of resonating of the laser element, if the semiconductor layers cannot be cleaved, no mirror surface can be formed, and an end face of a resonator cannot be formed of a plane of cleavage, and therefore, a problem arises, such that a semiconductor laser having high reflectance and high output cannot be obtained.

In addition, in the method wherein the cutting starting point can be created on the center portion side of the substrate, as described above, by forming a denatured region inside the substrate by irradiating the substrate with a laser beam, it can be expected that the substrate can be cracked relatively uniformly. However, as a result of the diligent research conducted by the present inventor, it was found that clear cleavage cannot be obtained without causing damage to the nitride semiconductor layers, even when GaAs or sapphire is used for the substrate as in the above described Japanese Unexamined Patent Publication 2003-338468.

SUMMARY OF THE INVENTION

The present invention is provided in order to solve these problems, and an object of the present invention is to provide a manufacturing method for a nitride semiconductor device where a wafer can easily be divided into chips in the case where a nitride semiconductor device such as a laser diode (LD), a light emitting diode (LED) or a transistor is manufactured using a nitride semiconductor, and in particular, an end face (surface) of a resonator can be formed with a cleavage plate, when an LD is formed, as well as a nitride semiconductor light emitting device obtained in accordance with this method.

Another object of the present invention is to provide a manufacturing method for a nitride semiconductor device, where a wafer laminated nitride semiconductor layers can easily be divided into chips without fail by providing optimal conditions for dividing the wafer into chips in accordance with a multiple photons absorbing method.

The present inventor diligently continued research on light emitting devices using nitride semiconductors, in order to find a means to provide an end surface of a resonator without fail by a cleavage and divide a wafer into chips with high yield, and as a result, found, in view of following (1) to (3), that by using a substrate made of a GaN based compound (GaN based compound means a compound where a part or the entirety of Ga is replaced with another group III element, such as Al or the like, in addition to GaN) as the substrate, and by causing multiple photons absorption by irradiating the substrate with a laser beam having a wavelength that is longer than the wavelength corresponding to the band gap energy of this substrate, processed traces, such as holes, can be formed in the substrate, and cutting starting points can be formed due to these processed traces, and thus, a wafer can be divided into chips by cleavage or cutting which is formed along the crystal face from the cutting starting points. Here, in the case where processed traces are formed on the surface of the substrate through radiation of a laser beam, materials that scatters by the radiation of the laser beam attach to a light emitting surface or the like, thus lowering the brightness, and therefore, it is preferable to form processed traces inside the substrate. Furthermore, whereby processed traces are formed in multiple in the direction of the depth, the substrate can be processed deeply with little damage. Therefore, a thick substrate can be cracked with less damage than with surface processing.

Figure 8A:
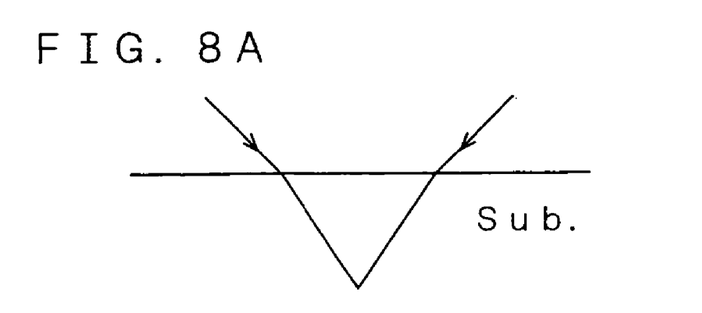
FIGS. 8A to 8C are diagrams showing variations in how a laser beam enters, depending on the refraction index of the substrate.
Figure 8B:
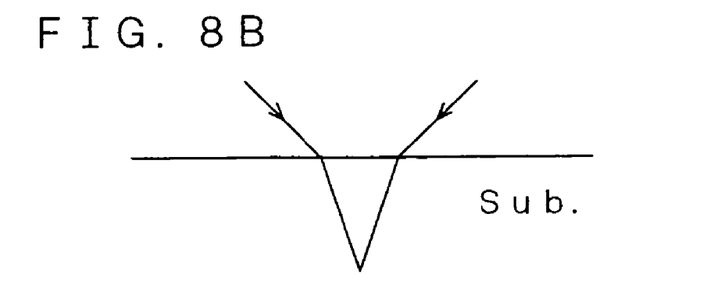
Figure 8C:
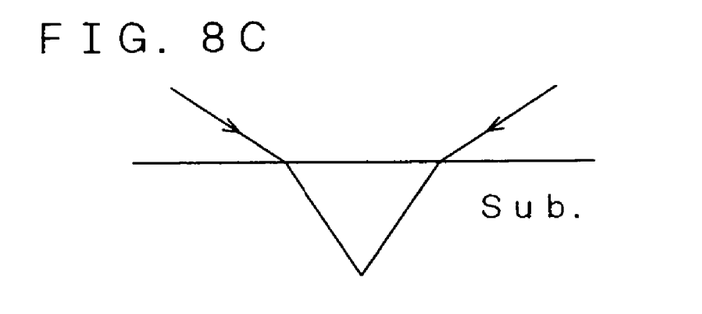

(1) That is to say, firstly, in a material having a large refraction index (3.8 in the case of GaAs) to a laser beam for radiation (for example a YAG laser having a wavelength of 1064 nm), the laser beam converges on the surface of the substrate when the laser beam enters into the substrate, as shown in FIG. 8B, and thereby, causing multiple photons absorption in an area of a wide range on the surface of the substrate not only at the focal point, due to a small difference in the energy density between the focal point and the surface, and thus, multiple photons absorption cannot be carried out only at the focal point, and a process with high precision cannot be carried out. As a result, it is difficult to cleave the substrate. Meanwhile, it was found that, as shown in FIG. 8A, when the refraction index of the substrate is small (for example 2.5 for GaN), the difference in the energy density between the surface of the substrate and the focal point becomes great, so that it is possible to carry out multiple photons absorption only at the focal point without being absorbed on the surface of the substrate, and thus, it is possible to form processed traces only at the focal point. Here, to speak only of the refraction index of the material for this substrate, a lens having a large numerical aperture (NA) is used as the lens for condensing a laser beam, and thereby, as shown in FIG. 8C, the laser beam can be converged in the same manner as when a material having a small refraction index is used, but the lens becomes expensive.

(2) Secondly, in the case where a material having a band gap energy which is much greater than that of a nitride semiconductor (for example the band gap energy of GaN, which is 3.4 eV), such as sapphire (band gap energy: 6.9 eV) is used for the substrate, it becomes necessary for the energy of the laser beam for the formation of the denatured region to be large, and a problem arises, such that nitride semiconductor layers are easily damaged by this energy, and thus, it was found that it is necessary for the substrate to have a band gap energy that is relatively close to that of the laminated nitride semiconductor layers, and not to have a band gap energy that is much greater than the band gap energy of the nitride semiconductor layers.

(3) Thirdly, it was found that in the case where the substrate is made of a material of a different type, such as Si, SiC, ZnO or sapphire, which is different from the material of the laminated nitride semiconductor layers, a laser beam is absorbed in the interface between the substrate and the nitride semiconductor layer, causing thermal and physical damage in the adjacent nitride semiconductor layers, and, for example, the light emitting layer of the light emitting device is damaged, which is not preferable.

From the above findings, it is optimal to use a substrate made of a GaN based compound, such as GaN or an AlGaN based compound where a portion or the entirety of Ga is replaced with Al in GaN, in terms of the material for the substrate, and as a result of further research, it was found that chips can be more easily obtained through cleavage by optimizing the wavelength and the intensity of the laser beam for radiation (irradiating) and the rate of absorption in the substrate, as shown in the following.

(4) That is to say, in the case where the laser beam for radiation (irradiating) has a wavelength which is no longer than a vicinity of the wavelength corresponding to the band gap energy of the material for the substrate, the laser beam is absorbed not only at the focal point but also on the surface of the substrate, causing damage to the surface before the inside is processed, and thus, it becomes impossible to process only the inside of the substrate. Therefore, it is preferable for the laser beam to have a wavelength that is greater than the wavelength corresponding to the vicinity of the band gap energy of the substrate, and in the case where the wavelength of the laser beam is longer, absorption of light is greatly reduced, and there is barely any normal absorption, and instead, multiple photons absorption is performed by increasing the energy for irradiating. As for this multiple photons absorption, two photons absorption is generated, where two photons are simultaneously absorbed, when the wavelength is two times, or less, of the wavelength corresponding to the band gap energy, so it is most efficient and preferable. Meanwhile, three photons absorption is generated, where three photons are simultaneously absorbed, when the wavelength is three times or less of the wavelength corresponding to the band gap energy, and n photons absorption is generated when the wavelength is n times, or less, of the wavelength corresponding to the band gap energy, and thus, a long wavelength can be used, but the greater the number n is, the more intense the energy needs to be in order to form a denatured region. And when the energy is intense, the damage to the nitride semiconductor layers becomes greater, which is not preferable, and thus, a laser beam having a wavelength which is longer than the wavelength corresponding to the band gap energy of the substrate and shorter than two times the wavelength corresponding to the band gap energy of the substrate is most preferable, and a laser beam having a wavelength that is three times longer than the wavelength corresponding to the band gap energy of the substrate can be used. Here, in the case where a YAG laser having a wavelength of 1064 nm, for example, is used, an apparatus for creating harmonic waves is unnecessary, though the efficiency of processing is not high, and thus, the YAG laser is effective for reducing the cost for the apparatus.

Figure 9:
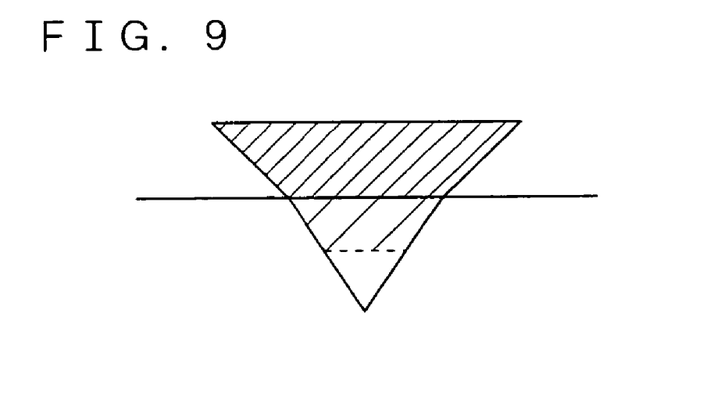
FIG. 9 is a diagram showing a phenomenon that a laser beam is absorbed on the surface without entering the inside in the case where the refraction index of the substrate is great.

(5) It was found that the ease of formation of a denatured region (processed traces of hole form) inside the substrate with higher precision greatly depends on the absorption coefficient in the substrate, which is determined by the material for the substrate and the wavelength of the laser beam for irradiating (radiation), and then, it was found that it is possible to form small processed traces only at the focal point inside the substrate without melting the portions to be processed or processing the surface of the substrate by adjusting the absorption coefficient so that the band gap wavelength is within a range from approximately 0.1 cm$^{-1}$ to 100 cm$^{-1}$. When a GaAs substrate as that described above is irradiated with a laser beam having a wavelength of 1064 nm, absorption starts from the surface of the substrate, and the laser beam is absorbed from the surface of the substrate, as shown in FIG. 9, where the intensity of energy is schematically indicated by the number of oblique lines, and therefore, the intensity becomes lower as the laser beam progresses toward the inside of the substrate, and the laser beam becomes very weak at the focal point, even though the laser beam is condensed.

(6) Furthermore, it was found that if the laser beam for irradiating (radiation) is too intense, the denatured region becomes of an exploded state or absorption increases on the surface of the substrate. This exploded state causes a large amount of cracking, and thus, makes it impossible to carry out a microscopic process, and when the laser beam is absorbed on the surface of the substrate, the laser beam cannot be concentrated on the focal point as in the case of the above described GaAs, and thus, it is possible to carry out a microscopic process. That is to say, optimal intensity is necessary instead of intensity greater than that which allows for processing, and as a result of diligent research by the present inventor, it was found that processing with very high precision becomes possible when the intensity T of the laser beam for irradiating is $5\times10^9$ W/cm$^2$<T<$2\times10^{10}$ W/cm$^2$.

A manufacturing method for a nitride semiconductor device according to the present invention includes the steps of; (a) forming a semiconductor lamination portion formed of nitride semiconductor layers which include at least an n-type layer and a p-type layer on a surface of a wafer made of a GaN based substrate, (b) forming processed traces in at least a portion of intended cutting lines, along which the wafer is divided into chips, and in a certain depth within the GaN based substrate, by irradiating a laser beam having a wavelength that is longer than a wavelength corresponding to a band gap energy of the GaN based substrate and an electrical field intensity, by which multiple photons absorption is caused, from a back surface side of the wafer, and (c) dividing the wafer along cutting starting points which are formed in the vicinity of the processed traces by hitting the wafer with an impact.

Here, GaN based compound means a compound of GaN, and in addition, a part or the entirety of Ga is replaced with another group III element, such as Al in GaN. In addition, nitride semiconductor means a semiconductor made of a compound of Ga, which is a group III element, and N, which is a group V element, or a compound where a part or the entirety of Ga, which is a group III element, is replaced with another group III element, such as Al or In and/or a compound (nitride) where a part of N, which is a group V element, is replaced with another group V element, such as P or As. Furthermore, multiple photons absorption means a phenomenon where a laser beam is absorbed in a material when the conditions nhv>Eg>hv (n=2, 3, 4 . . . ) are satisfied in the case where the intensity of the laser beam is very high, although when the band gap energy Eg of the material and the energy hv of one photon of the laser beam satisfy the relationship Eg>hv, it is not absorbed by one photon (optically transparent state).

It is preferable that a wavelength of the laser beam to be irradiated is longer than the wavelength corresponding to the band gap energy of the GaN based substrate and no greater than three times of the wavelength, because this allows multiple photons absorption efficiently.

A wavelength of the laser beam to be irradiated may be set to such a wavelength that an absorption coefficient of the substrate is within a range from 0.1 cm$^{-1}$ to 100 cm$^{-1}$ for the wavelength corresponding to the band gap energy of the substrate in a relation of a material of the substrate and the wavelength of the laser beam.

Concretely, it is most preferable that the GaN based substrate is made of GaN and the wavelength of the laser beam to be irradiated is 500 nm to 700 nm. In this case, the second harmonic wave of a YAG laser (fundamental wavelength: 1064 nm) has a wavelength of 532 nm, which corresponds to approximately two times the wavelength corresponding to the band gap energy of GaN, and can be used as it is. Here, the fundamental wave of a YAG laser can be used as the three time wave of a wave having the wavelength corresponding to the band gap energy of a GaN substrate.

In the case where an intensity T of the laser beam to be irradiated is $5\times10^9$ W/cm$^2$<T<$2\times10^{10}$ W/cm$^2$, processed traces can be formed inside the substrate without fail and without affecting the surface of the substrate and the semiconductor lamination portion, which is preferable.

A thickness of the GaN based substrate is 100 μm to 400 μm and the depth on which the processed traces are formed is in a range between 5 μm from the back surface of the substrate, and 15 μm from a front surface which is an opposite surface to the back surface of the substrate, and thereby, processed traces can be formed inside the substrate without fail and without negatively affecting an element that is formed in the nitride semiconductor lamination portion, which is preferable.

Second processed traces are formed at a location of 5 μm to 50 μm away from the processed traces perpendicularly to the surface of the GaN based substrate, and thereby, two or more processed traces are formed at a distance away from each other in the vertical direction, and therefore, the GaN based substrate can be easily cracked even though the substrate is thick, which is preferable.

The semiconductor lamination portion, formed of the nitride semiconductor layers is formed so as to compose a laser diode having a light emitting region in stripe form, and wherein the wafer is divided into chips so that an end face of the light emitting region in stripe form becomes a plane of cleavage, and thereby, a very high performance of the semiconductor laser for emitting from blue to ultraviolet light having a mirror surface as an end face can be obtained.

The semiconductor lamination portion formed of the nitride semiconductor layers is formed so as to compose a light emitting diode, and thereby, it is possible to divide into chips without fail, and an LED for emitting from blue to ultraviolet light can be easily obtained cheaply.

A nitride semiconductor light emitting device according to the present invention includes; a GaN based substrate, and a semiconductor lamination portion which is formed by laminating nitride semiconductor layers including at least an n-type layer and a p-type layer so as to form a light emitting layer on the GaN based substrate, wherein a chip is formed by dividing a wafer formed of the GaN based substrate and the semiconductor lamination portion into chips, and wherein processed traces which are formed by irradiating a laser beam inside the substrate are exposed on at least one side surface of the chip, and the one side surface is formed as a broken surface caused by the processed traces.

The semiconductor lamination portion is formed so as to compose a laser diode having a light emitting region in stripe form, and wherein the chip is formed from the wafer by dividing, so that an end face of the light emitting region in stripe form is a plane of cleavage formed by cleaving which is caused on the processed traces, and thereby, a mirror surface resulting from a plane of cleavage can be used as an end face of a resonator, and thereby, a high performance semiconductor laser can be obtained.

According to the manufacturing method for a nitride semiconductor device of the present invention, nitride semiconductor layers are laminated on the GaN based substrate, and the inside of this substrate is irradiated with a laser beam of which the wavelength is longer than the wavelength corresponding to the band gap energy of the substrate so that multiple photons absorption is caused, and the refraction index of the substrate is as small as approximately 2.5, and in addition, the wavelength of the laser beam is longer than the wavelength corresponding to the band gap energy of the substrate, and thereby, no light is absorbed by any of the surface of the substrate, the interface between the substrate and the nitride semiconductor layers, and the nitride semiconductor lamination portion, and only one point in the substrate, which is a focal point where the laser beam is condensed, is heated. In addition, since the substrate is made of a GaN based material, nitrogen evaporates through heating and the portions of nitrogen are broken off and become holes, and thus, processed traces are formed. At this time, it is considered that the focal point is in a state where the crystallinity of the GaN based compound collapses. As a result, cracking is induced much more easily, as compared to the case in which the focal point is melted, and the substrate and the nitride semiconductor lamination portion can be cleaved along the cutting starting points, which are slightly at a distance away from the processed traces. In addition, as the inside of the substrate is processed through irradiation with a laser beam, processed refuses resulting from processing through irradiation with a laser beam are not scattered, and thus, no contamination adheres to the light emitting surface, no contamination adheres to the surface on which an electrode is formed, thereby not making the surface uneven, and no problem such as shortening between electrodes occurs. Furthermore, since the substrate is a GaN based substrate having excellent lattice matching with the nitride semiconductor lamination portion, a high quality device can be fabricated.

Furthermore, since the wavelength and the intensity of the laser beam for irradiating as well as the depth where the substrate is irradiated can be optimized, a more precise cleavage can be provided. As a result, end faces of a resonator can be formed through the cleavage in an LD using a nitride semiconductor, and thereby, a very high performance semiconductor laser for emitting from blue to ultraviolet light can be obtained. Furthermore, in the case of an LED, a wafer can be very easily divided into chips for a device for emitting from blue to ultraviolet light having very hard nitride semiconductor layers grown on the substrate, and the wafer can be cut along the intended cutting lines without fail, and therefore, the number of wasted chips resulting from deviations in the cracking can be greatly reduced, increasing the yield, which greatly contributes to the reduction in cost. Here, dividing into chips for transistors also becomes very easy, leading to a reduction in the cost.

DETAILED DESCRIPTION

Figure 1A:
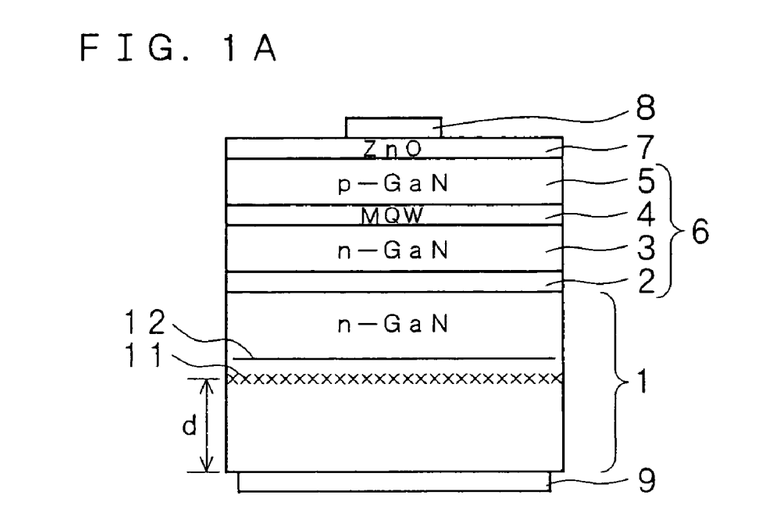
FIGS. 1A to 1C are a cross section diagram showing an LED chip, a diagram showing intended cutting lines which are lines when a wafer divided into chips and a schematic diagram showing the radiation of a laser beam according to one embodiment of the present invention.
Figure 1B:
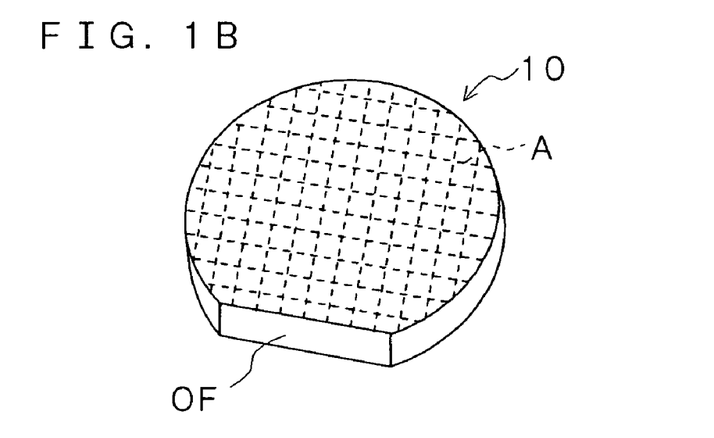
Figure 1C:
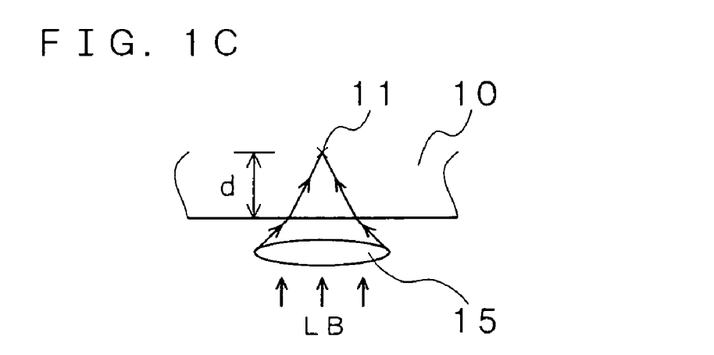

Next, a manufacturing method for a nitride semiconductor device according to the present invention and a nitride semiconductor light emitting device which is obtained in accordance with this manufacturing method are described in reference to the drawings. As for the nitride semiconductor device according to the present invention, FIG. 1A is a cross sectional diagram showing a nitride semiconductor light emitting device (LED chip) that has been divided into chips according to one embodiment, and FIG. 1B is a perspective diagram showing a wafer on which intended cutting lines are drawn, and as shown in these respective figures, first, a semiconductor lamination portion 6 is formed of nitride semiconductor layers, which at least include an n-type layer 3 and a p-type layer 5, on a surface of a wafer 10 formed of a GaN based substrate 1, and next, as shown in FIG. 1C, which is a schematic diagram showing the radiation of a laser beam LB, at least a portion of intended cutting lines A (see FIG. 1B), along which wafer 10 is divided into chips, is irradiated with laser beam LB having a wavelength which is longer than the wavelength corresponding to the band gap energy of GaN based substrate 1 (hereinafter, may be simply referred to as band gap wavelength) and having a sufficient electrical field intensity to cause multiple photons absorption so that the focal point is adjusted at a certain depth d within GaN based substrate 1 from a back surface of the wafer 10, and thereby, processed traces 11 are formed inside GaN substrate 1 using a laser beam. After that, the wafer 10 is hit with an impact, and thereby, the wafer 10 is cut along cutting starting points 12 which are formed in the vicinity of the processed traces 11.

That is to say, the present invention is characterized in that a GaN based substrate 1, for example, a GaN substrate, is used as a substrate on which nitride semiconductor layers are grown. Here, a substrate having a thickness of approximately 100 µm to 400 µm can be used, and the thickness of the substrate can be reduced so as to have a thickness in this range before the wafer is cut. As described above, the present inventor diligently conducted research to find how the wafer could be easily divided into chips with a high yield for an LDS, an LEDS or transistor devices using nitride semiconductor layers, and as a result, it was found that the most effective manner was to grow nitride semiconductor layers using a GaN based substrate as the substrate, to form processed traces inside the substrate through the multiple photons absorption by a laser beam along intended cutting lines along which the substrate is divided into chips, and to cut the substrate by hitting the substrate having these processed traces with an impact.

Figure 2:
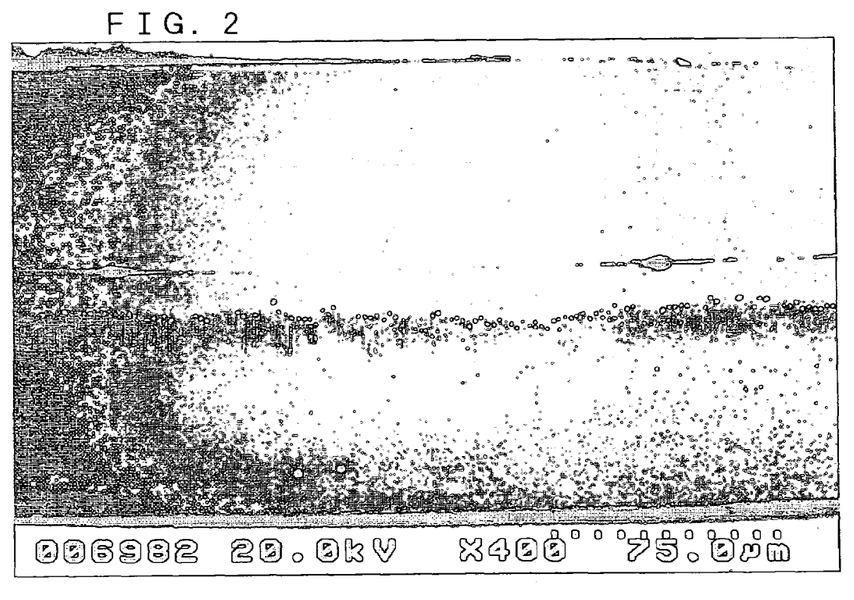
FIG. 2 is an SEM photograph of a cross section of the vicinity of processed traces cleaved from the wafer according to the present invention.

The reasons why a GaN based substrate is selected as the substrate, is firstly described. As described in reference to the above FIGS. 8A to 8C, when the refraction index of the substrate is large, such as GaAs (refraction index: 3.8), processing is performed on the surface of the substrate, which is not preferable and the laser beam does not progress in a focal point, while the refraction index of GaN is 2.5, which is very small, and no such problems is raised with a GaN based material. In addition, the GaN based substrate is a material of the same type as the nitride semiconductor lamination portion, which is grown on the surface of the substrate, and thus, the crystallinity of the nitride semiconductor layers is increased so that the performance of the device can be increased while no nitride semiconductor layers having a good crystallinity can be grown on a semiconductor substrate such as GaAs or Si, which are not used into practice. Furthermore, when a GaN based compound is irradiated with a laser beam, N is easily removed, providing processed traces where vacant spaces (holes) are created as shown in FIG. 2, which is a photograph showing an enlarged cleavage plane having a portion of laser processed traces, cutting starting points which extend laterally above the processed trances and a flat surface which appears throughout the entire surface above this cutting starting points, which more easily contribute to the cutting of the substrate by hitting the substrate with an impact in comparison with the state where a portion is melted through laser processing.

Secondly, sapphire and SiC, which are at present generally used for substrates for growing nitride semiconductor layers, have a band gap energy that is much larger than that of nitride semiconductor layers, and it was found that these are not appropriate as a substrate for growing nitride semiconductor layers, in terms of formation of processed traces through radiation of the laser beam. That is, though processed traces cannot be formed unless the substrate absorbs a laser beam to a certain extent, sapphire or the like have a very short band gap wavelength, and therefore, nitride semiconductor layers completely absorb the laser beam and are damaged when the nitride semiconductor layers are irradiated with a laser beam having a wavelength that can be easily absorbed in the substrate. Therefore, though it is necessary to irradiate a laser beam having a wavelength that cannot be absorbed by nitride semiconductor layers, a laser beam having such a wavelength is not easily absorbed by sapphire or the like in multiple photons absorption, and therefore, the intensity of the laser beam must be increased. When the intensity of the laser beam is increased, the laser beam is absorbed by the nitride semiconductor layers, and the nitride semiconductor layers are damaged, and a problem arises, such that the properties of the device deteriorate. Accordingly, an appropriate process for multiple photons absorption cannot be carried out on nitride semiconductor devices which are in practice as devices at present, where sapphire or SiC is used as a substrate.

Thirdly, when a process for multiple photons absorption was attempted to be carried out on nitride semiconductor layers which were grown on a substrate of a different type from nitride semiconductors, it has been found that a problem arises, such that a laser beam is absorbed in the interface between the substrate and the nitride semiconductor layers due to the hetero junction between the two. When a laser beam is absorbed in the interface between the nitride semiconductor layers and the substrate, the nitride semiconductor layers are very thin, and therefore, the element that is formed in the nitride semiconductor layers is damaged, which is not preferable. In addition, the ratio of mismatching of the lattice constant between nitride semiconductors and sapphire or SiC, which is put into practice at present, is large, and the properties of the element sometimes deteriorate, due to defects in the crystals, and thus, substrates of which the type of material is different from nitride semiconductors are not preferable, from the point of view of processing for multiple photons absorption, in addition to the properties of the device. Of course, GaAs, Si and the like have similar problems.

From the view of the above, a GaN based compound is used as a substrate according to the present invention, and use of such a GaN based substrate allows for easy lattice matching with nitride semiconductor layers, and in addition, since semiconductor layers are the same type with the substrate, a nitride semiconductor device having very high performance can be formed, and in addition, the GaN based substrate can be divided using processed traces caused by multiple photons absorption through radiation of the laser beam, though the GaN based substrate is a very hard and breakable substrate, and chips can be created very efficiently, making the manufacturing process easy and greatly increasing the yield.

A low temperature buffer layer 2 made of, for example, n-type GaN, and semiconductor lamination portion 6 which is formed of an n-type layer 3 made of, for example, an n-type GaN layer, an active layer 4 having a multiple quantum well structure (MQW) made of an undoped InGaN base compound, and a p-type layer 5 made of, for example, p-type GaN, are laminated on one surface (front surface) of the wafer 10 made of a GaN based substrate 1, as described above, and a light transmitting conductive layer 7 made of, for example, ZnO, is provided on a front surface thereof, and a p-side electrode 8 made of Ti/Au and an n-side electrode 9 made of Ti—Al alloy are formed on the front surface and the other surface (back surface) of GaN based substrate 1, respectively. Light is emitted from the surface having p-side electrode 8, and therefore, p-side electrode 8 is formed so as to be as small as possible in size, while the metal film for the n-side electrode 9 is provided on an entire back surface excepting the vicinity of the intended cutting lines along which the chip is divided by the below described irradiation with a laser beam (surroundings of the chip in FIG. 1A) in the present invention, though the n-side electrode 9 is formed on the entire surface in the case where light is not emitted from the back surface, as in most prior cases. The formation of this semiconductor lamination portion 6 and the electrodes is described in detail below.

Figure 3:
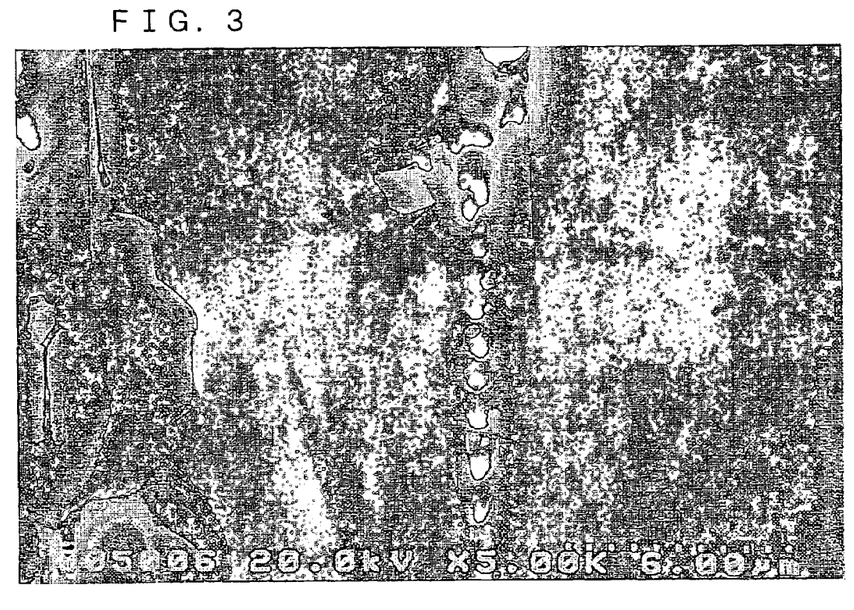
FIG. 3 is a photograph of a cross section showing processed traces formed by the radiation of a laser beam according to the present invention.

Next, this wafer 10 is placed on an x-y table, and the focal point of a condensing lens 15 is adjusted to a predetermined depth d from the back surface of GaN based substrate 1 along the intended cutting lines A as show in FIG. 1B, along which the wafer 10 is divided into chips, and a laser beam LB having a wavelength which is the second harmonic wave (wavelength: 532 nm) of a YAG laser source is radiated through the above described condensing lens 15, while the x-y table is continuously moved along intended cutting lines A, and thereby, processed traces 11 are formed at a constant depth d along intended cutting lines A continuously in the longitudinal and lateral directions (x-y coordinate) on the back surface of the substrate. As shown in the enlarged photograph of FIG. 3, processed traces in hole form are continuously formed side by side in the vertical direction (which is a direction of the depth of the substrate) through radiation of the laser beam in one pulse so as to be arranged upward and downward with the focal point at the center. After irradiation in this one pulse, the laser source is shifted by approximately 1 μm to 8 μm, preferable approximately 1.5 μm to 3 μm, along the intended cutting lines before the next radiation is carried out. In the case where the distance is too short, the efficiency becomes poor, and a distance of no less than one wavelength, specifically no less than two times the wavelength, is efficient, while a distance that is too great does not allow for the formation of a clean plane of cleavage. Intervals of 10 μm or more do not allow for a clean plane of cleavage to be obtained.

Here, as for the intended cutting lines, in the case where the nitride semiconductor lamination portion is formed on a C-face, processed traces are formed so as to coincide with the A-face (1120) or the M-face (1100), and thus, the wafer is cut along these crystal faces, making cleavage easy. The direction of these crystal faces can be adjusted with precision through the orientation of the orientation flat OF of the wafer. Though the intended cutting lines A are shown in grid form in FIG. 1B, the wafer is cut into bars in the longitudinal or lateral direction, and after that, processed traces are again formed in the same manner in the lateral or longitudinal direction, and then the bars cut into chips. Here, in the latter cutting into chips, bars are easily cracked, and thus, dicing can also be used.

This condensing lens has a numerical aperture NA of approximately 0.4, which is relatively small, and the refraction index of GaN based substrate 1 for this frequency is as small as approximately 2.5, and therefore, the laser beam is intensely condensed only at the focal point for irradiation, without being condensed on the surface of the substrate.

These processed traces 11 are continuously formed at intervals of 1 μm to 8 μm, preferable 1 μm to 5 μm, as described above, along the intended cutting lines A, and after that, the wafer 10 can be cut based on the cutting starting points 12 which are formed in the vicinity of the processed traces 11 by hitting the wafer 10 with an impact. An SEM photograph of a cross section of the plane of cleavage after actually cleavage in accordance with this method is shown in the above described FIG. 2. In FIG. 2, the portion that extends laterally in bubble form is the processed traces 11, the fine line which extends in the lateral direction several μm above these processed traces is the cutting starting points, and the portion above this line is a clear plane of cleavage. Here, the lower side in the figure is the back surface of the substrate, and the laser beam is radiated from the back surface side of the substrate (lower side of the figure).

Figure 7:
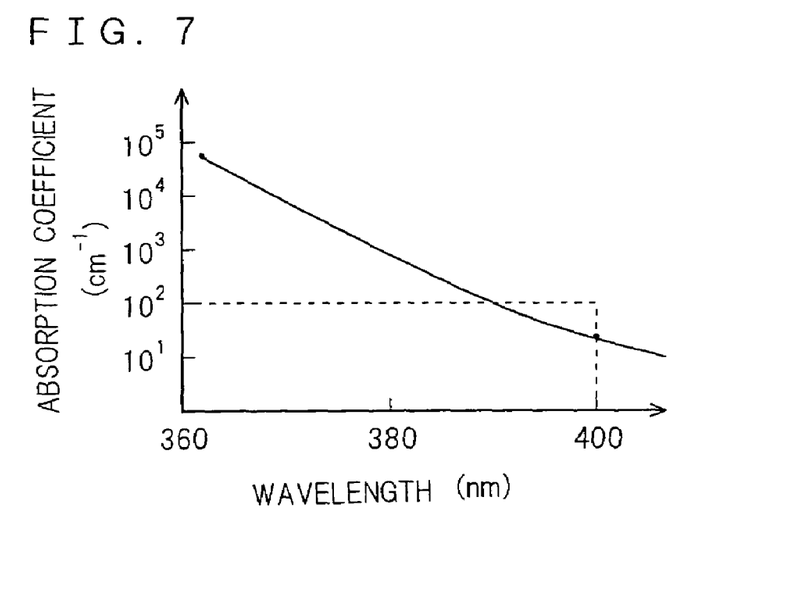
FIG. 7 is a graph showing the relationship of the absorption coefficient to the wavelength in GaN doped with oxygen.

The present inventor, further conducted diligently research in order to obtain the optimal conditions for the wavelength and the intensity of the laser beam for this irradiation. As described above, the ratio of absorption is very high in the case where the wavelength of the laser beam for irradiation is in the vicinity of the band gap wavelength of this substrate, and the laser beam is absorbed in the surface of the substrate, irrespectively of the focal point. The change in the absorption coefficient to the wavelength in GaN into which O, for example, is doped, is shown in FIG. 7, and in this manner, though the absorption coefficient is approximately $5 \times 10^4$ $cm^{-1}$, which is very high for the band gap wavelength (363 nm), the coefficient lowers as the wavelength increases. In accordance with this ratio of change, the absorption coefficient suddenly lowers in the case where the material for the substrate is a direct transition type semiconductor, and the absorption coefficient lowers to approximately 100 $cm^{-1}$ in case where it is longer than the band gap wavelength by approximately 20 nm, and thus, light is condensed at the focal point within the substrate, without being absorbed in the surface, so that multiple photons absorption can be generated.

The present inventor examined how the processed traces are formed (whether or not they are good) by using various dopant materials doped into the GaN substrate and changing the wavelength of the radiated laser beam, and thereby, changing the absorption coefficient of the material for the substrate. As a result, as is clear from Table 1, it is necessary for the absorption coefficient of the material for the substrate to be selected so as to fall within a range from 0.1 $cm^{-1}$ to 100 $cm^{-1}$. This is because when the absorption coefficient is too great, the laser beam is absorbed on the surface of the substrate and cannot be condensed at the focal point, while in the case where the absorption coefficient is too small, the laser beam cannot be absorbed to form the processed traces, even when condensed at the focal point. Though when the intensity of the laser beam is increased, the laser beam can of course be sufficiently absorbed to form processed traces 11, if the intensity of the laser beam is increased too much, the nitride semiconductor layers are damaged, which is not preferable.

TABLE 1

Relation between absorption coefficient and condition for processed traces

| Absorption coefficient ($cm^{-1}$) | $10^{-4}$ | $10^{-3}$ | $10^{-2}$ | 0.1 | 1 | 10 | $10^2$ | $10^3$ | $10^4$ | $10^5$ |
|---|---|---|---|---|---|---|---|---|---|---|
| Condition of processing | X | X | Δ | ◯ | ◯ | ◯ | ◯ | Δ | Δ | X |

◯: Good
Δ: Slightly No Good
X: No Good

Meanwhile, the effects of the frequency of the laser beam were examined, assuming that the absorption coefficient of the substrate was constant. That is to say, as described above, light having a band gap wavelength for the material for this substrate is greatly absorbed, and the absorption coefficient is approximately $10^4$ $cm^{-1}$ to $10^6$ $cm^{-1}$, and the ratio of absorption lowers as the wavelength becomes longer, though how the ratio of lowering differs depending on the material. Therefore, generally the ratio of absorption becomes no greater than 100 $cm^{-1}$, as described above, for light having a wavelength of no shorter than approximately 1.5 times the band gap wavelength, and the laser beam can be condensed at the focal point without processing the surface. In this case, two-photon absorption, where two photons are simultaneously absorbed for a wavelength that is no greater than two times of the band gap wavelength, three-photon absorption, where three photons are simultaneously absorbed for a wavelength that is no greater than three times of the band gap wavelength, and n-photon absorption, where n photons are simultaneously absorbed for a wavelength that is no greater than n times of the band gap wavelength, occur respectively, and the efficiency of the absorption of multiple photons lowers as the number n increases, and therefore, two-photon absorption is most efficient. From this point of view, a wavelength which is 1.1 to 2 times longer than the band gap wavelength of the material for the substrate, particularly 1.3 to 2 times longer, is most preferable. In the case where GaN is used for the substrate, a laser beam having a wavelength of 500 nm to 700 nm is appropriate, and the second harmonic wave of a YAG laser can be used. Here, in the case where a YAG laser having a wavelength of 1064 nm, which is the fundamental wavelength, is used, an apparatus for creating harmonic waves becomes unnecessary and the cost for the apparatus can be effectively reduced, though the efficiency for processing drops becomes low.

Furthermore, the present inventor continued research to find the optimal conditions for the intensity of the radiated laser beam. That is to say, it is found out that, for example, when multiple photons absorption is generated as described above, in the case where the energy for radiation is too high, a problem arises, such that the nitride semiconductor layers are damaged, and in addition, the focal point becomes of an exploded state, making it to difficult to obtain a clean cleavage, and a problem such that the laser beam is absorbed on the surface of the substrate before proceeding into the substrate arises when the energy is further intensified. Thus, the present inventor got the results shown in Table 2 by conducting research on the state where processed traces are formed for various intensities of the laser beam. Here, the radiated laser beam may be a pulse or a continuous wave, and the results shown in Table 2 are data obtained when each portion was irradiated with a pulse width of 8 ns, a frequency of 30 kHz and various energy densities. Here, the energy density was obtained by converting the energy (W) of the laser beam into intensity per unit time and unit area, and is a value obtained by dividing the energy per pulse (energy÷pulse frequency) by the area of the spot that was irradiated with the laser beam (diameter: 1 μm). In addition, the energy of the laser beam became (irradiation energy−reflection loss−absorption loss) and the absorption loss is the (absorption coefficient)×(depth of processing).

TABLE 2

Condition of processing VS. Intensity of laser beam

| Intensity (W/cm$^2$) | Condition of processing |
|---|---|
| $5 \times 10^9$ | Not processed |
| $7 \times 10^9$ | Good processed |
| $1 \times 10^{10}$ | Good processed |
| $1.8 \times 10^{10}$ | Good processed |
| $2 \times 10^{10}$ | Exploded state |
| $5 \times 10^{10}$ | Absorbed on surface |

As is clear from Table 2, no processing is carried out when the energy density is no greater than $5 \times 10^1 \times 8$ ns ($=4 \times 10^1$ [(W/cm$^2$)·s]), and an exploded state or absorption on the surface is shown when the energy density is no less than $2 \times 10^{10} \times 8$ ns ($1.6 \times 10^2$ [(W/cm$^2$)·s]), and appropriate processing can be carried out by irradiating a laser beam having an intensity within such a range as to be between the two.

Furthermore, the present inventor continued diligent research in order to find the optimal depth for forming processed traces in the substrate, and as a result, found that it is preferable to make the processed traces in a depth of the substrate that is no less than 20 μm away from the front surface (opposite surface to the back surface irradiated with the laser beam), and as close to the nitride semiconductor layers as possible, because the nitride semiconductor layers may be damaged if it is too close, depending on the wavelength of the irradiated laser beam and the intensity of the energy. That is to say, in the case where the processed portion and the core portion of the device are close to each other, the heat generated on the processed portion is conveyed to the nitride semiconductor layers and the dopants move, and the semiconductor layers are damaged. Therefore, it is preferable for the cleavage of the semiconductor lamination portion to hold a distance from the front surface of the substrate, of no smaller than 20 μm and to be as close as possible to the nitride semiconductor lamination portion which is provided on the front surface. In the case where the substrate is not very thick, the processed portion on the back surface side of the substrate can provide sufficiently clean cleavage. Though the back surface of the substrate may be irradiated, if the laser beam is weak, it is preferable for the back surface of the substrate not to be irradiated with an intense laser beam such that processed traces are formed, because scattering of contamination, such as cutting refuse, should be prevented. And it is preferable for the processed portion to be 5 μm or more inside the substrate from the back surface. That is to say, in the case of a substrate having a thickness of approximately 100 μm, it is preferable for the processed portion to be at a depth (d) of 5 μm to 80 μm from the back surface of the substrate, more preferably approximately 50 μm to 60 μm.

Figure 4:
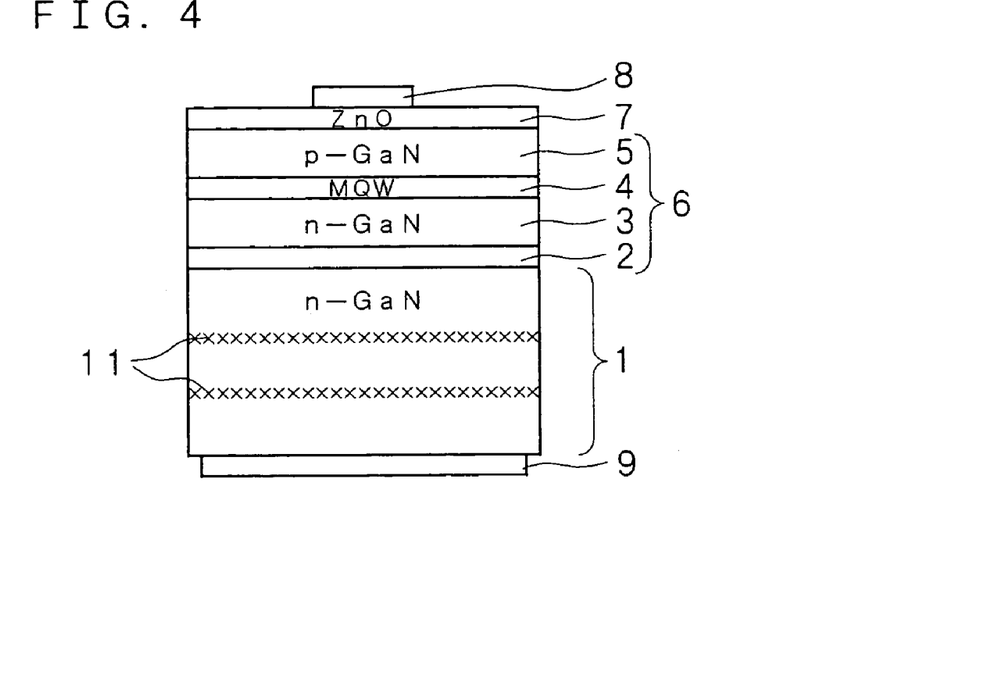
FIG. 4 is a cross sectional diagram showing a modification of FIG. 1A in the same manner as in FIG. 1A.

In the case where a process is carried out on the substrate through the multiple photons absorption, when the thickness of the substrate is as great as 200 μm to 400 μm, two or more processed traces can be formed at the same coordinate on the substrate and at different depths in the vertical direction, as shown in, for example, FIG. 4, which is the same type of diagram as FIG. 1(a). By doing so, cracking starts at two or more portions in the vertical direction in the substrate so that even a thick substrate can be easily cut. In this case, since cutting starting points are formed at a location approximately 5 μm to several tens of μm away from the processed traces, the interval between the processed traces in the vertical direction is preferable to be greater than that, and not to be too great. Therefore, it is preferable for the interval between processed traces formed at different depths in the vertical direction to be approximately 5 μm to 50 μm, preferably approximately 10 μm to 30 μm. Here, in order to form the plural processed traces at different depths in the vertical direction, the focal point of the laser beam can be shifted, and thereby, the location of the processed traces can be easily changed. Here, in FIG. 4, the same symbols are attached to the same portions as those in FIG. 1A, and the descriptions thereof are omitted.

Though FIG. 1A shows an example of the simplest configuration for forming an LED as an example of a nitride semiconductor lamination, in reality, various configurations can be adopted, such that a gradient layer, where the composition gradually changes, is provided as an interlayer between layers having different compositions or above or below the active layer, or the n-type layer and the p-type layer may be formed as a complex layer which has a layer having a large band gap energy (for example, an AlGaN based compound) and a layer having a high concentration for a conductivity. In the example shown in FIG. 1A, an n-type layer 3 made of GaN having a thickness of approximately 1 μm to 10 μm, an active layer 4 having a MQW structure formed of undoped InGaN based compound/GaN (for example, a multiple quantum well structure where three to eight pairs of well layers made of $In_{0.17}Ga_{0.83}N$, having a thickness of 1 nm to 3 nm, and barrier layers made of $In_{0.01}Ga_{0.99}N$, having a thickness of 10 nm to 20 nm, are layered) having a total thickness of approximately 0.05 μm to 0.3 μm and a p-type layer 5 made of GaN into which Mg has been doped, having a thickness of approximately 0.2 μm to 1 μm, are laminated, respectively, and thereby, a nitride semiconductor lamination portion 6 is formed. In addition, a light transmitting conductive layer 7 made of, for example, ZnO having a thickness of approximately 0.01 μm to 5 μm is provided on the surface of the nitride semiconductor lamination portion.

A manufacturing method for this LED is described in further detail. First, a wafer made of a GaN substrate 1 of an n-type, for example, is placed in, for example, an MOCVD (metal organic chemical vapor deposition) apparatus, and the above described semiconductor layers are epitaxially grown sequentially on one surface (front surface) of the wafer. At this time, necessary gasses, of reactive gasses such as trimethyl gallium (TMG), ammonia (NH$_3$), trimethyl aluminum (TMA) and trimethyl indium (TMIn), SiH$_4$, which is a dopant gas in the case of the n-type, and cyclopentadienyl magnesium ($Cp_2Mg$) as a p-type dopant gas are supplied together with $H_2$, which is a carrier gas, and thereby, semiconductor layers having a desired composition and a desired conductivity type can be formed so as to have a desired thickness. In addition, the ratio of In of the InGaN based compound of the active layer 4 can be changed by controlling the amount of flow of TMIn, which is a material gas for In.

First, the low temperature buffer layer 2 made of GaN into which Si has been doped is deposited when the substrate temperature of the wafer is at approximately 400° C. to 600° C., which is a low temperature, and an n-type layer 3 made of GaN doped with Si is grown so as to have a thickness of approximately 1 μm to 10 μm at approximately 800° C. to 1200° C. of the substrate temperature. Next, the substrate temperature is downed to approximately 600° C. to 800° C., and approximately 3 to 8 pairs of undoped well layers made of $In_{0.17}Ga_{0.83}N$ having a thickness of approximately 1 nm to 3 nm and barrier layers made of GaN having a thickness of approximately 10 nm to 20 nm are alternately layered, and thereby, an active layer 4 having an MQW structure and a thickness of 0.05 μm to 0.3 μm is layered. Approximately $1\times10^{17}$ cm$^{-3}$ to $5\times10^{19}$ cm$^{-3}$ Of Si may have been doped into these layers. Next, the temperature of the substrate (within the growth apparatus) is raised to approximately 800° C. to 1200° C., for example, to approximately 1000° C., and the p-type layer 5 made of GaN doped with Mg is grown so as to have a thickness of approximately 0.2 μm to 1 μm, and thereby, the semiconductor lamination portion 6 is formed.

After that, a light transmitting conductive layer 7 made of, for example, ZnO, which can make an ohmic contact with p-type semiconductor layer 5, is provided on the surface of the semiconductor lamination portion 6 so as to have a thickness of approximately 0.01 μm to 5 μm. This ZnO film is formed so as to have a specific resistance of approximately $3\times10^{-4}$ Ω·cm to $5\times10^{-4}$ Ω·cm by doping Ga. This light transmitting conductive layer 7 is not limited to ZnO, and may be made of ITO or may be a thin alloy layer of Ni and Au having a thickness of approximately 2 nm to 100 nm, which allows light to transmit while allowing a current to spread throughout the entirety of the chip.

Then, the back surface of the substrate 1 is polished so that the thickness of the substrate 1 becomes approximately 100 μm, and after that, Ti and Al or the like are deposited and alloyed on the back surface thereof so as to be removed only the portion surrounding the chip (the vicinity of the intended cutting lines) by, for example, a lift off method, and thereby, the n-side electrode 9 is formed, and furthermore, the p-side electrode 8 having a Ti/Au layer structure is formed on the surface of the light transmitting conductive layer 7 only in an area that is required for the bonding pad in accordance with a lift of f method. After that, the entirety of the chip is coated with an SiON film, not shown, in accordance with a plasma CVD method, and thus, an opening is created in electrode portions. After that, from the back surface side of the substrate 1 is irradiated with a laser beam, as described in the above, so that processed traces are formed in columns, and the wafer is cut into bars along these processed traces, and furthermore, these bars are aligned and irradiated with the laser beam, and then the bars are divided into chips by hitting them with an impact. As a result, an LED chip having the structure shown in FIG. 1A is formed.

According to the present invention, the wafer can be cut with a very high precision, and therefore, complete cleavage is possible by making the intended cutting lines (lines made by processed traces) completely coincide with a crystal face (for example, A-face or M-face when layers are grown on C-face), and even in the case where there is a slight shift of the intended cutting lines, a very clean cut is possible without making cracking progress in the lateral direction even when a complete mirror surface is not provided. Therefore, direct cutting is possible, even though, in the prior art, dry etching was carried out necessarily in order to make semiconductor lamination portions into mesa form in advance, before cutting the wafer into chips. As a result, the cutting from the wafer into chips becomes very simple, and in addition, the regions which were removed through etching in the prior art contribute as light emitting portions, which leads to a decrease in the cost and a great increase in the brightness. Furthermore, since the GaN based material is used for the substrate, the substrate can be made to be conductive so that one of the electrodes on the back surface of the substrate, and thus, it is not necessary to etch the nitride semiconductor lamination portion on this aspect. As a result, this LED can be manufactured without entirely etching the nitride semiconductor lamination portion, which is difficult to etch, and therefore, the number of steps in the manufacturing process can be greatly reduced.

Figure 5:
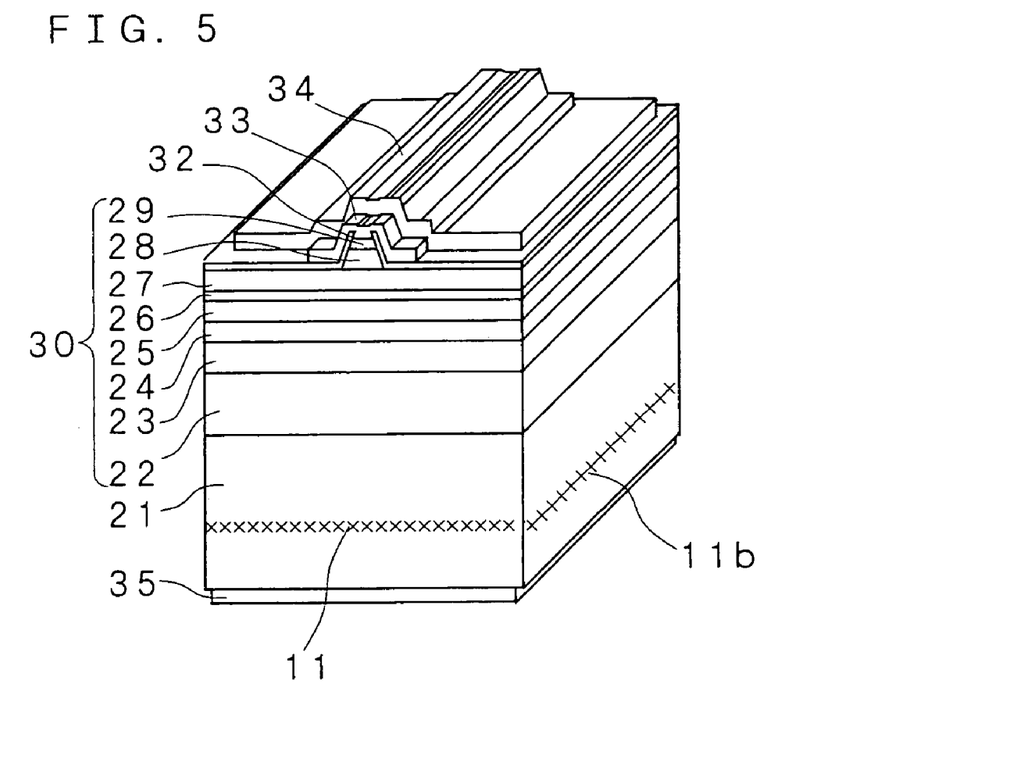
FIG. 5 is a diagram showing the cross sections of an LD chip having a structure of a nitride semiconductor device according to another example of the present invention.

The example shown in FIG. 1 is an example of an LED, while in the case of an LD, effects are greater when end faces of the laser resonator can be provided as a mirror surface through cleavage, and thus, the reflection coefficient can be greatly increased. An example of such an LD chip is shown in FIG. 5 as an example of a ridge type LD.

That is to say, an n-type buffer layer 22 having a thickness of approximately 4 μm and made of n-type GaN doped with, for example, Si in approximately $3\times10^{18}$ cm$^{-3}$, an n-type clad layer 23 having a thickness of approximately 1 μm and made of n-type $Al_{0.08}Ga_{0.92}N$ doped with, for example, Si in approximately $3\times10^{17}$ cm$^{-3}$, an n-type guide layer 24 made of n-type GaN doped with, for example, Si in approximately $1\times10^{17}$ cm$^{-3}$ and having a thickness of approximately 0.1 μm, an active layer 25 having a thickness of approximately 54 nm composed of a multiple quantum well (MQW) structure, where n-type GaN layers (approximately 9 nm) having an impurity concentration of approximately $3\times10^{18}$ cm$^{-3}$, and approximately 3 pairs of undoped $In_{0.1}Ga_{0.9}N$ layers (approximately 3 nm)/n-type GaN layers (approximately 12 nm) having a concentration of approximately $3\times10^{18}$ cm$^{-3}$, are layered, a block layer 26 having a thickness of approximately 25 nm and made of p-type $Al_{0.2}Ga_{0.8}N$ doped with, for example, Mg in approximately $5\times10^{19}$ cm$^{-3}$, a p-type guide layer 27 having a thickness of approximately 0.1 μm and made of GaN doped with Mg in approximately $5\times10^{19}$ cm$^{-3}$, a p-type clad layer 28 having a thickness of approximately 0.4 μm and made of $Al_{0.08}Ga_{0.92}N$ doped with, for example, Mg in approximately $5\times10^{19}$ cm$^{-3}$, and a p-type contact layer 29 having a thickness of approximately 0.1 μm and made of GaN doped with, for example, Mg in approximately $1\times10^{20}$ cm$^{-3}$ are sequentially laminated on, for example, an n-type GaN substrate 21, and thereby, a semiconductor lamination portion 30 epitaxially grown is formed.

After that, a mask of $SiO_2$ or the like, not shown, is formed, and the semiconductor lamination portion 30 is dry etched until p-type guide layer 27 is exposed or just before it is exposed, thereby being formed into a mesa form. After that, an insulating layer 32 made of, for example, $ZrO_2$ is formed by, for example, a sputtering method with the mask being left as it is, and then, the mask is removed, and thereby, an insulating layer 32 is formed on the side wall portions excluding the upper surface of the mesa form, and on the bottom of the mesa form. Then, Ni/Au, for example, are deposited on the entire surface through vapor deposition or the like and patterned, and thereby, a p-side contact electrode 33 is formed only in the vicinity of the mesa region in stripe form. After that, a p-side pad electrode 34 having a layer structure of Ni and Au is formed on almost the entirety of the surface, excluding the peripheral portion of the chip in accordance with, for example, a lift off method. After that, the back surface of the substrate 21 is polished so as to reduce the thickness of the substrate 21 to approximately 100 μm, and Ti and Al films are deposited in accordance with a vapor deposition method and are sintered, and thereby, an n-side electrode 35 is formed of a Ti—Al alloy.

After that, the processed traces 11 are formed along lines in the direction perpendicular to the stripes along which the wafer is divided into chips through the above described radiation of the laser beam. At this time, the laser beam is radiated so that the columns of the processed traces 11 completely coincide with A-face or M-face. Then, the wafer is cleaved by hitting it with an impact, and thereby, bars are formed. The processed traces 11b are formed in these bars in the same manner along the intended cutting lines, and the wafer is divided into chips by hitting the bars with an impact in the same manner. Here, it is not necessary for the dividing in the direction parallel to the stripe to provide a plane of cleavage, and the plane may not completely coincide with the crystal face or the bars may be cut through dicing. Here, the material for electrodes or the lamination structure of the semiconductor layers to compose an LD is not limited to the above described examples, and a variety of the lamination structures can be formed.

Figure 6:
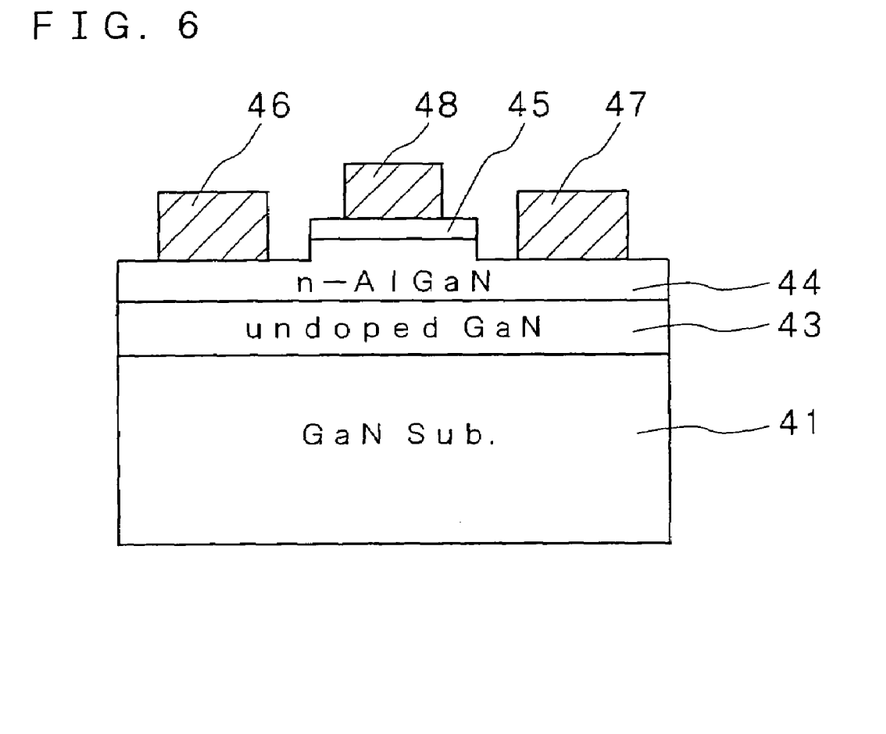
FIG. 6 is a cross sectional diagram showing the configuration of a transistor according to another embodiment of the present invention.

FIG. 6 shows an example where a transistor is formed. That is to say, an undoped GaN layer 43 having a thickness of approximately 4 μm, an n-type AlGaN based compound electron transit layer 44 having a thickness of approximately 10 nm and an undoped AlGaN based compound layer 45 having a thickness of approximately 5 nm are sequentially grown on a GaN substrate 41 in the same manner as the above, undoped AlGaN based compound layer 45 is etched and removed so that the width, which is the gate length, of approximately 1.5 μm remains, and electron transit layer 44 is exposed. Then, a source electrode 46 and a drain electrode 47 are formed of, for example, a Ti film and an Au film on electron transit layer 44 that has been exposed through etching, and a gate electrode 48 is formed on the surface of the undoped AlGaN based compound layer 45 by layering, for example, a Pt film and an Au film, and thus, a transistor is formed. When the wafer on which a great number of transistors are formed as described above is divided into chips, a laser beam is radiated so that the processed traces are formed in the same manner as the above described examples, and thus, chips can be easily provided, and a high speed transistor (HEMT) having a small leak current and an excellent withstanding voltage can be obtained at a low cost.

Although preferred examples have been described in some detail it is to be understood that certain changes can be made by those skilled in the art without departing from the spirit and scope of the invention as defined by the appended claims.

What is claimed is:

1. A manufacturing method for a nitride semiconductor device, comprising the steps of:
   (a) forming a semiconductor lamination portion formed of nitride semiconductor layers which include at least an n-type layer and a p-type layer on a surface of a wafer made of a GaN based substrate,
   (b) forming processed traces in at least a portion of intended cutting lines, along which the wafer is divided into chips, and in a certain depth within the GaN based substrate and with intervals of approximately 1.5 μm to 3.0 μm between adjacent processed traces, by irradiating a laser beam having a wavelength that is longer than a wavelength corresponding to a band gap energy of the GaN based substrate and an electrical field intensity, by which multiple photons absorption is caused, and
   (c) dividing the wafer along cutting starting points which are formed in the vicinity of the processed traces.

2. The manufacturing method for a nitride semiconductor device according to claim 1, wherein the processed traces are formed by creating holes.

3. The manufacturing method for a nitride semiconductor device according to claim 1, wherein a wavelength of the laser beam to be irradiated is longer than the wavelength corresponding to the band gap energy of the GaN based substrate and no greater than three times of the wavelength.

4. The manufacturing method for a nitride semiconductor device according to claim 3, wherein the GaN based substrate is made of GaN and the wavelength of the laser beam to be irradiated is 500 nm to 700 nm.

5. The manufacturing method for a nitride semiconductor device according to claim 1, wherein an intensity T of the laser beam to be irradiated is $5 \times 10^9$ W/cm$^2$ < T < $2 \times 10^{10}$ W/cm$^2$.

6. The manufacturing method for a nitride semiconductor device according to claim 1, wherein the semiconductor lamination portion, formed of the nitride semiconductor layers is formed so as to compose a laser diode having a light emitting region in stripe form, and wherein the wafer is divided into chips so that an end face of the light emitting region in stripe form becomes a plane of cleavage.

7. The manufacturing method for a nitride semiconductor device according to claim 1, wherein the semiconductor lamination portion formed of the nitride semiconductor layers is formed so as to compose a light emitting diode.

8. A manufacturing method for a nitride semiconductor device, comprising the steps of:
   (a) forming a semiconductor lamination portion formed of nitride semiconductor layers which include at least an n-type layer and a p-type layer on a surface of a wafer made of a GaN based substrate,
   (b) forming processed traces in at least a portion of intended cutting lines, along which the wafer is divided into chips, and in a certain depth within the GaN based substrate, by irradiating a laser beam having a wavelength that is longer than a wavelength corresponding to a band gap energy of the GaN based substrate and an electrical field intensity, by which multiple photons absorption is caused, from a back surface side of the wafer, and
   (c) dividing the wafer along cutting starting points which are formed in the vicinity of the processed traces by hitting the wafer with an impact,
   wherein a wavelength of the laser beam to be irradiated is set to such a wavelength that an absorption coefficient of the substrate is within a range from 0.1 cm$^{-1}$ to 100 cm$^{-1}$ for the wavelength corresponding to the band gap energy of the substrate in a relation of a material of the substrate and the wavelength of the laser beam.

9. The manufacturing method for a nitride semiconductor device according to claim 8, wherein an absorption coefficient of the substrate is adjusted within a range from 0.1 cm$^{-1}$ to 100 cm$^{-1}$ for the wavelength corresponding to the band gap energy of the substrate, by doping an impurity into the substrate.

10. A manufacturing method for a nitride semiconductor device, comprising the steps of:
    (a) forming a semiconductor lamination portion formed of nitride semiconductor layers which include at least an n-type layer and a p-type layer on a surface of a wafer made of a GaN based substrate, (b) forming processed traces in at least a portion of intended cutting lines, along which the wafer is divided into chips, and in a certain depth within the GaN based substrate, by irradiating a laser beam having a wavelength that is longer than a wavelength corresponding to a band gap energy of the GaN based substrate and an electrical field intensity, by which multiple photons absorption is caused, from a back surface side of the wafer, and (c) dividing the wafer along cutting starting points which are formed in the vicinity of the processed traces by hitting the wafer with an impact, wherein a thickness of the GaN based substrate is 100 µm to 400 µm and the depth on which the processed traces are formed is in a range between 5 µm from the back surface of the substrate, and 15 µm from a front surface which is an opposite surface to the back surface of the substrate.

11. The manufacturing method for a nitride semiconductor device according to claim 10, wherein second processed traces are formed at a location of 5 µm to 50 µm away from the processed traces perpendicularly to the surface of the GaN based substrate.

12. A nitride semiconductor light emitting device, comprises:

a GaN based substrate, and a semiconductor lamination portion which is formed by laminating nitride semiconductor layers including at least an n-type layer and a p-type layer so as to form a light emitting layer on the GaN based substrate, wherein a chip is formed by dividing a wafer formed of the GaN based substrate and the semiconductor lamination portion into chips, and wherein processed traces which are formed by irradiating a laser beam inside the substrate are exposed on at least one side surface of the chip, and the one side surface is formed as a broken surface caused by the processed traces, and processed traces are formed with intervals of approximately 1.5 µm to 3 µm therebetween.

13. The nitride semiconductor light emitting device according to claim 12, wherein the semiconductor lamination portion is formed so as to compose a laser diode having a light emitting region in stripe form, and wherein the chip is formed from the wafer by dividing, so that an end face of the light emitting region in stripe form is a plane of cleavage formed by cleaving which is caused on the processed traces.

14. A manufacturing method for a nitride semiconductor device, comprising the steps of:

(a) forming a semiconductor lamination portion formed of nitride semiconductor layers which include at least an n-type layer and a p-type layer on a surface of a wafer made of a GaN based substrate, (b) forming processed traces in at least a portion of intended cutting lines, along which the wafer is divided into chips, and in a certain depth within the GaN based substrate and with intervals of approximately 1.5 µm to 3.0 µm between adjacent processed traces, by irradiating a laser beam having a wavelength that is 1.1 times to 2 times a wavelength corresponding to a band gap energy of the GaN based substrate and an electrical field intensity, by which multiple photons absorption is caused, and (c) dividing the wafer along cutting starting points which are formed in the vicinity of the processed traces.

15. The manufacturing method for a nitride semiconductor device according to claim 14, wherein the GaN based substrate is made of GaN and the wavelength of the laser beam to be irradiated is 500 nm to 700 nm.

16. A manufacturing method for a nitride semiconductor device, comprising the steps of:

(a) forming a semiconductor lamination portion formed of nitride semiconductor layers which include at least an n-type layer and a p-type layer on a surface of a wafer made of a GaN based substrate, (b) forming processed traces in at least a portion of intended cutting lines, along which the wafer is divided into chips, and in a certain depth within the GaN based substrate, by irradiating a laser beam having a wavelength that is longer than a wavelength corresponding to a band gap energy of the GaN based substrate and having an electrical field intensity by which multiple photons absorption is caused, and (c) dividing the wafer along cutting starting points which are formed in the vicinity of the processed traces, wherein the processed traces are formed with intervals of two times or more of a wavelength of the laser beam and less than 10 µm between adjacent processed traces.

* * * * *